(12) United States Patent
Chehade et al.

(10) Patent No.: US 12,200,901 B2
(45) Date of Patent: Jan. 14, 2025

(54) METHOD AND EXTRACTION SYSTEM FOR EXTRACTING AN ELECTRONIC DEVICE FROM AN IMMERSIVE COOLING CONTAINER

(71) Applicant: OVH, Roubaix (FR)

(72) Inventors: Ali Chehade, Moncheaux (FR); Gregory Francis Louis Bauchart, Wattrelos (FR); Alexandre Alain Jean-Pierre Meneboo, Harnes (FR)

(73) Assignee: OVH, Roubaix (FR)

( * ) Notice: Subject to any disclaimer, the term of this patent is extended or adjusted under 35 U.S.C. 154(b) by 195 days.

(21) Appl. No.: 17/690,839

(22) Filed: Mar. 9, 2022

(65) Prior Publication Data

US 2022/0315399 A1    Oct. 6, 2022

(30) Foreign Application Priority Data

Apr. 1, 2021  (EP) ..................................... 21305427
Jan. 10, 2022  (EP) ..................................... 22305018

(51) Int. Cl.
*F28F 7/00* (2006.01)
*F28D 21/00* (2006.01)
(Continued)

(52) U.S. Cl.
CPC ......... *H05K 7/20236* (2013.01); *F28D 21/00* (2013.01); *F28F 3/027* (2013.01);
(Continued)

(58) Field of Classification Search
CPC ....... G06F 1/20; G06F 1/206; H05K 7/20236; H05K 7/1488; H05K 7/1489;
(Continued)

(56) References Cited

U.S. PATENT DOCUMENTS 2,115,501 A   4/1938  Sergius
2,316,296 A   4/1943  Simonds
(Continued)

FOREIGN PATENT DOCUMENTS

CN   201898432 U   7/2011
CN   103687443 A   3/2014
(Continued)

OTHER PUBLICATIONS

Notice of Allowance with regard to the counterpart U.S. Appl. No. 17/691,494 dated Apr. 17, 2023.
(Continued)

*Primary Examiner* — Davis D Hwu
(74) *Attorney, Agent, or Firm* — BCF LLP (57) ABSTRACT

A method and an extraction system for extracting an electronic device from a container filled with an immersion cooling liquid are disclosed. The extraction system includes a lifting device for lifting the electronic device from an open end of the container, a liquid dispersing device for dispersing immersion cooling liquid from the electronic device by generating an air flow, and a nozzle configured to be positioned above the open end of the container to limit a spread of immersion cooling liquid caused by the liquid dispersing device.

13 Claims, 9 Drawing Sheets

(51) Int. Cl.
*F28F 3/02* (2006.01)
*G06F 1/20* (2006.01)
*H01L 23/367* (2006.01)
*H01L 23/44* (2006.01)
*H01L 23/473* (2006.01)
*H05K 7/14* (2006.01)
*H05K 7/20* (2006.01)

(52) U.S. Cl.
CPC ............... *G06F 1/20* (2013.01); *G06F 1/206* (2013.01); *H01L 23/3672* (2013.01); *H01L 23/44* (2013.01); *H01L 23/473* (2013.01); *H05K 7/1488* (2013.01); *H05K 7/1489* (2013.01); *H05K 7/20245* (2013.01); *H05K 7/20254* (2013.01); *H05K 7/20263* (2013.01); *H05K 7/20272* (2013.01); *H05K 7/203* (2013.01); *H05K 7/20327* (2013.01); *H05K 7/20336* (2013.01); *H05K 7/20763* (2013.01); *H05K 7/20772* (2013.01); *H05K 7/20781* (2013.01); *H05K 7/20809* (2013.01); *H05K 7/20818* (2013.01); *F28D 2021/0029* (2013.01); *G06F 2200/201* (2013.01)

(58) Field of Classification Search
CPC ..... H05K 7/20245; F28D 21/00; F28D 3/027; H01L 23/3672; H01L 23/44; H01L 23/473
USPC ....................................................... 165/80.4
See application file for complete search history.

(56) References Cited

U.S. PATENT DOCUMENTS

| | | | |
|---|---|---|---|
| 3,938,689 A | 2/1976 | De Munnik | |
| 4,279,966 A | 7/1981 | Wakana et al. | |
| 4,619,316 A | 10/1986 | Nakayama et al. | |
| 4,888,664 A | 12/1989 | Rojc | |
| 5,268,814 A | 12/1993 | Yakubowski | |
| 5,307,956 A | 5/1994 | Richter et al. | |
| 5,669,524 A | 9/1997 | Loedel | |
| 5,907,473 A | 5/1999 | Przilas et al. | |
| 6,023,934 A | 2/2000 | Gold | |
| 6,746,388 B2 | 6/2004 | Edwards et al. | |
| 6,847,525 B1 | 1/2005 | Smith et al. | |
| 6,883,593 B2 | 4/2005 | Johnson et al. | |
| 6,899,164 B1 | 5/2005 | Li et al. | |
| 7,369,410 B2 | 5/2008 | Chen et al. | |
| 7,403,392 B2 | 7/2008 | Attlesey et al. | |
| 7,414,845 B2 | 8/2008 | Attlesey et al. | |
| 7,527,085 B2 | 5/2009 | Ijima et al. | |
| 7,724,517 B2 | 5/2010 | Attlesey et al. | |
| 7,885,070 B2 | 2/2011 | Campbell et al. | |
| 7,900,796 B2 | 3/2011 | Ungrady et al. | |
| 7,905,106 B2 | 3/2011 | Attlesey | |
| 7,911,782 B2 | 3/2011 | Attlesey et al. | |
| 7,911,793 B2 | 3/2011 | Attlesey | |
| 8,009,419 B2 | 8/2011 | Attlesey et al. | |
| 8,014,150 B2 | 9/2011 | Campbell et al. | |
| 8,089,764 B2 | 1/2012 | Attlesey | |
| 8,089,765 B2 | 1/2012 | Attlesey | |
| 8,089,766 B2 | 1/2012 | Attlesey | |
| 8,291,964 B2 | 10/2012 | Hwang et al. | |
| 8,305,759 B2 | 11/2012 | Attlesey et al. | |
| 8,467,189 B2 | 6/2013 | Attlesey | |
| 8,619,425 B2 | 12/2013 | Campbell et al. | |
| 8,654,529 B2 | 2/2014 | Tufty et al. | |
| 8,934,244 B2 | 1/2015 | Shelnutt et al. | |
| 8,953,317 B2 | 2/2015 | Campbell et al. | |
| 9,049,800 B2 | 6/2015 | Shelnutt et al. | |
| 9,051,502 B2 | 6/2015 | Sedarous et al. | |
| 9,086,859 B2 | 7/2015 | Tufty et al. | |
| 9,128,681 B2 | 9/2015 | Tufty et al. | |
| 9,144,179 B2 | 9/2015 | Shelnutt et al. | |
| 9,155,230 B2 | 10/2015 | Eriksen | |
| 9,176,547 B2 | 11/2015 | Tufty et al. | |
| 9,195,282 B2 | 11/2015 | Shelnutt et al. | |
| 9,223,360 B2 | 12/2015 | Tufty et al. | |
| 9,328,964 B2 | 5/2016 | Shelnutt et al. | |
| 9,335,802 B2 | 5/2016 | Shelnutt et al. | |
| 9,351,429 B2 | 5/2016 | Shelnutt et al. | |
| 9,382,914 B1 | 7/2016 | Sharfi | |
| 9,426,927 B2 | 8/2016 | Shafer et al. | |
| 9,436,235 B2 | 9/2016 | Damaraju et al. | |
| 9,464,854 B2 | 10/2016 | Shelnutt et al. | |
| 9,529,395 B2 | 12/2016 | Franz et al. | |
| 9,699,938 B2 | 7/2017 | Shelnutt et al. | |
| 9,699,939 B2 | 7/2017 | Smith | |
| 9,717,166 B2 | 7/2017 | Eriksen | |
| 9,756,766 B2 | 9/2017 | Best | |
| 9,773,526 B2 | 9/2017 | Shelnutt et al. | |
| 9,781,859 B1 | 10/2017 | Wishman et al. | |
| 9,795,065 B2 | 10/2017 | Shelnutt et al. | |
| 9,839,164 B2 | 12/2017 | Shelnutt et al. | |
| 9,844,166 B2 | 12/2017 | Shelnutt et al. | |
| 9,921,622 B2 | 3/2018 | Shelnutt et al. | |
| 9,968,010 B2 | 5/2018 | Shelnutt et al. | |
| 9,992,914 B2 | 6/2018 | Best et al. | |
| 10,010,013 B2 | 6/2018 | Shelnutt et al. | |
| 10,018,425 B2 | 7/2018 | Shelnutt et al. | |
| 10,020,242 B2 | 7/2018 | Katsumata et al. | |
| 10,064,314 B2 | 8/2018 | Shelnutt et al. | |
| 10,104,808 B2 | 10/2018 | Scharinger et al. | |
| 10,130,008 B2 | 11/2018 | Shepard et al. | |
| 10,143,113 B2 | 11/2018 | Shelnutt et al. | |
| 10,143,114 B2 | 11/2018 | Shelnutt et al. | |
| 10,146,231 B2 | 12/2018 | Shelnutt et al. | |
| 10,149,408 B2 | 12/2018 | Fujiwara et al. | |
| 10,156,873 B2 | 12/2018 | Shelnutt et al. | |
| 10,172,262 B2 | 1/2019 | Shelnutt et al. | |
| 10,206,312 B2 | 2/2019 | Shelnutt et al. | |
| 10,212,857 B2 | 2/2019 | Eriksen | |
| 10,225,958 B1 | 3/2019 | Gao | |
| 10,238,010 B2 | 3/2019 | Shelnutt et al. | |
| 10,271,456 B2 | 4/2019 | Tufty et al. | |
| 10,321,609 B2 | 6/2019 | Hirai et al. | |
| 10,331,144 B2 | 6/2019 | Shelnutt et al. | |
| 10,399,190 B2 | 9/2019 | North et al. | |
| 10,542,635 B2 | 1/2020 | Nishiyama | |
| 10,598,441 B2 | 3/2020 | Kawabata et al. | |
| 10,617,042 B2 | 4/2020 | Shelnutt et al. | |
| 10,622,283 B2 | 4/2020 | Leobandung | |
| 10,624,236 B2 | 4/2020 | Inano et al. | |
| 10,624,242 B2 | 4/2020 | Best | |
| 10,638,641 B2 | 4/2020 | Franz et al. | |
| 10,645,841 B1 | 5/2020 | Mao et al. | |
| 10,653,036 B1 | 5/2020 | Gao | |
| 10,667,434 B1 | 5/2020 | Mao et al. | |
| 10,674,641 B2 | 6/2020 | Shepard et al. | |
| 10,716,238 B2 | 7/2020 | Brink | |
| 10,729,039 B2 | 7/2020 | Shelnutt et al. | |
| 10,791,647 B1 | 9/2020 | Miyamura et al. | |
| 10,809,011 B2 | 10/2020 | Chu et al. | |
| 10,871,807 B2 | 12/2020 | Best et al. | |
| 10,888,032 B2 | 1/2021 | Wakino et al. | |
| 10,917,998 B2 | 2/2021 | Shelnutt et al. | |
| 10,932,390 B2 | 2/2021 | Korikawa | |
| 10,939,580 B2 | 3/2021 | Gao | |
| 10,939,581 B1 | 3/2021 | Chen et al. | |
| 10,990,144 B2 | 4/2021 | Wang et al. | |
| 11,006,547 B2 | 5/2021 | Gao | |
| 11,032,939 B2 | 6/2021 | Tufty et al. | |
| 11,071,238 B2 | 7/2021 | Edmunds et al. | |
| 11,107,749 B2 | 8/2021 | Taniguchi et al. | |
| 11,268,739 B2 | 3/2022 | Wang et al. | |
| 11,751,359 B2 | 9/2023 | Heydari | |
| 11,822,398 B2 | 11/2023 | Heydari | |
| 2002/0159233 A1 | 10/2002 | Patel et al. | |
| 2004/0244947 A1 | 12/2004 | Chen | |
| 2005/0150637 A1 | 7/2005 | Tan et al. | |
| 2005/0248922 A1 | 11/2005 | Chu et al. | |
| 2007/0227756 A1 | 10/2007 | Doerr et al. | |
| 2009/0146294 A1 | 6/2009 | Hillman et al. | |

(56) References Cited

U.S. PATENT DOCUMENTS

| | | |
|---|---|---|
| 2009/0205590 A1 | 8/2009 | Vetrovec |
| 2009/0260777 A1 | 10/2009 | Attlesey et al. |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St Rock et al. |
| 2012/0058588 A1* | 3/2012 | Mayer .................. H01L 21/228 257/E21.135 |
| 2012/0075797 A1 | 3/2012 | Attlesey |
| 2012/0120599 A1 | 5/2012 | Chua et al. |
| 2012/0193068 A1 | 8/2012 | Nemesh et al. |
| 2013/0105120 A1 | 5/2013 | Campbell et al. |
| 2014/0123492 A1 | 5/2014 | Campbell et al. |
| 2014/0216688 A1 | 8/2014 | Shelnutt et al. |
| 2014/0218845 A1 | 8/2014 | Peng et al. |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | St Rock et al. |
| 2016/0021793 A1 | 1/2016 | Chen |
| 2016/0120059 A1 | 4/2016 | Shedd et al. |
| 2016/0305565 A1 | 10/2016 | Miller et al. |
| 2016/0330874 A1 | 11/2016 | Sato et al. |
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1 | 5/2017 | Campbell et al. |
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | Wei et al. |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1 | 3/2020 | Enright et al. |
| 2020/0150731 A1* | 5/2020 | Wang ................. H05K 7/20781 |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| JP | 6814288 B2 * | 1/2021 |
| NL | 1006486 C2 | 1/1999 |
| TW | I 678 961 B | 12/2019 |
| WO | 2011006150 A1 | 1/2011 |
| WO | WO2012162986 A1 * | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | WO2020102090 A1 * | 5/2020 |
| WO | 2020170079 A1 | 8/2020 |
| WO | 2020/183038 A1 | 9/2020 |
| WO | 2020216954 A1 | 10/2020 |
| WO | 2020223806 A1 | 11/2020 |
| WO | 2020234600 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.

"IBM's Hot-Water Supercomputer Goes Live", Data Center Knowledge, retrieved on Jul. 19, 2021, 9 pages.

Extended European Search Report with regard to the EP Patent Application No. 21306771.3 completed May 23, 2022.

Extended European Search Report with regard to the EP Patent Application No. 21306173.2 completed Feb. 18, 2022.

Extended European Search Report with regard to the EP Patent Application No. 21306174.0 completed Feb. 14, 2022.

Extended European Search Report with regard to the EP Patent Application No. 21306172.4 completed Feb. 15, 2022.

English Abstract for JP2020065002 retrieved on Espacenet on Jun. 2, 2022.

(56) References Cited

OTHER PUBLICATIONS

Extended European Search Report with regard to the EP Patent Application No. 21306186.4 completed Feb. 10, 2022.
Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Office Action with regard to the counterpart U.S. Appl. No. 17/701,422 dated Mar. 28, 2023.
International Search Report and Written Opinion with regard to PCTIB2022053071 dated Jun. 28, 2022.
International Search Report and Written Opinion with regard to PCT/IB2022/052975 dated Jun. 20, 2022.
International Search Report and Written Opinion with regard to PCTIB2022052330 dated May 30, 2022.
International Search Report and Written Opinion with regard to PCT/IB2022/052976 dated Jun. 17, 2022.
International Search Report and Written Opinion with regard to PCT/IB2022/052977 dated Jun. 20, 2022.
European Search Report with regard to EP21306170.8 completed Feb. 12, 2022.
European Search Report with regard to EP21306189.8 completed Feb. 10, 2022.
Office Action with regard to the counterpart U.S. Appl. No. 17/697,452 dated May 11, 2023.
Extended European Search Report with regard to the counterpart EP Patent Application No. 22305018.8 completed Jun. 24, 2022.
Office Action with regard to the counterpart U.S. Appl. No. 17/698,480 dated Sep. 7, 2023.
Office Action with regard to the counterpart U.S. Appl. No. 17/697,264 dated Nov. 22, 2023.
Office Action with regard to the counterpart U.S. Appl. No. 17/697,452 dated Nov. 22, 2023.
Office Action with regard to the counterpart U.S. Appl. No. 17/694,765 dated Dec. 21, 2023.
Office Action with regard to the counterpart U.S. Appl. No. 17/698,037 mailed Feb. 26, 2024.
Office Action with regard to the counterpart U.S. Appl. No. 17/697,616 mailed Feb. 26, 2024.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Office Action with regard to te counterpart CN Patent Application No. 2022103375051 issued May 11, 2024.
Notice of Allowance with regard to te counterpart U.S. Appl. No. 17/697,616 issued Jul. 23, 2024.
Office Action with regard to te counterpart U.S. Appl. No. 17/698,480 issued Jul. 3, 2024.
Office Action with regard to the counterpart CN Patent Application No. 2022103478109 issued Aug. 30, 2024.
Notice of Allowance with regard to the counterpart U.S. Appl. No. 17/707,200 issued Aug. 15, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.
Office Action with regard to the counterpart U.S. Appl. No. 17/697,452 issued Sep. 6, 2024.

* cited by examiner

METHOD AND EXTRACTION SYSTEM FOR EXTRACTING AN ELECTRONIC DEVICE FROM AN IMMERSIVE COOLING CONTAINER

CROSS-REFERENCE

The present patent application claims priority from European Patent Application No. 21305427.3, filed on Apr. 1, 2021, and from European Patent Application No. 22305018.8 filed on Jan. 10, 2022, the entirety of each of which is incorporated by reference herein.

FIELD OF TECHNOLOGY

The present technology relates to immersive cooling systems. In particular, the present technology relates to an extraction system for extracting an electronic device from an immersive cooling container.

BACKGROUND

Data centers are used to house computer systems such as servers and associated equipment (e.g., networking equipment). The servers and associated electronic equipment are conventionally grouped in racks which store multiple such servers, typically aligned in rows in order to define aisles therebetween from which the electronic equipment stored in the racks can be accessed. Large data centers and other large computing facilities may contain thousands of racks supporting thousands or even tens of thousands of servers.

As the servers and other electronic equipment generate significant amounts of heat, ensuring adequate cooling of the electronic equipment stored in the racks is an important consideration. Notably, the performance of the electronic equipment can be compromised by excess heat, in some cases even leading to failure.

Immersion cooling (sometimes called immersive cooling) is a recently introduced solution for cooling servers. It consists in storing the servers in immersion tanks (also referred to as "immersion racks" given that they replace the conventional racks used in data centers) that are fully or partially filled with a non-electrically conductive cooling liquid, for example an oil-based dielectric cooling liquid. In this manner, good thermal contact is obtained between the servers and the cooling medium, namely the dielectric cooling liquid. However, when removing a server from an immersion tank (e.g., to perform maintenance on the server), an outer surface of the server is covered with the dielectric cooling liquid and therefore the server must first be cleaned by the operator in order to perform maintenance thereon. The cleaning process can be a tedious task that can be made difficult by the viscosity of the dielectric cooling liquid which is typically much greater (e.g., 10 to 15 times greater) than that of water, thereby even potentially causing the operator to inadvertently drop the server.

A system for extraction and manipulation of electronic devices from immersive cooling containers which alleviates at least some of the inconveniences present in the prior art is thus desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

It is an object of the present technology to ameliorate at least some of the inconveniences of the prior art.

According to one aspect of the present technology, there is provided an extraction system for extracting an electronic device from a container filled with an immersion cooling liquid, the extraction system comprising a lifting device for lifting the electronic device from an open end of the container, a liquid dispersing device for dispersing immersion cooling liquid from the electronic device by generating an air flow and a nozzle configured to be positioned above the open end of the container to limit a spread of immersion cooling liquid caused by the air flow.

In some implementations of the present technology, a lower end of the nozzle has a same shape as the open end of the container.

In some implementations of the present technology, the liquid dispersing device is located within the nozzle.

In some implementations of the present technology, the liquid dispersing device is configured for aspirating the immersion cooling liquid such that immersion cooling liquid is aspirated off the electronic device.

In some implementations of the present technology, the system further comprises a controller in communication with the lifting device and in communication with the liquid dispersing device, the controller being operable to actuate the lifting device synchronously with the liquid dispersing device.

In some implementations of the present technology, the lifting device extends at least in part within the nozzle in order to lift the electronic device through the nozzle.

In some implementations of the present technology, the lifting device comprises a pulley rotatable about a pulley axis, a line wrapping around the pulley and an attaching member connected to the line and configured to be attached to an attachment point of the electronic device.

In some implementations of the present technology, the attaching member is a hook.

In some implementations of the present technology, the lifting device further comprises a motor operatively connected to the pulley to selectively cause rotation of the pulley about the pulley axis in order to lift the attaching member.

In another aspect, various implementations of the present technology provide a cart for performing maintenance on a server system, the cart comprising a cart body, a plurality of wheels connected to the cart body and the extraction system, the extraction system being supported by the cart body.

In some implementations of the present technology, the cart further comprises an operation platform for operating on the electronic device after extraction from the container; and a control arm configured to receive the electronic device from the lifting device and change an orientation of the electronic device for positioning onto the operation platform.

In some implementations of the present technology, the control arm is configured rotate the electronic device from a generally vertical orientation to a generally horizontal orientation in order to position the electronic device on the operation platform in the generally horizontal orientation.

In some implementations of the present technology, the cart further comprises a collecting bin for receiving immersion cooling liquid that is removed from the electronic device, the collecting bin being disposed below the nozzle.

In some implementations of the present technology, the cart further comprises a filter for filtering out impurities contained in immersion cooling liquid being routed to the collecting bin.

In yet another aspect, various implementations of the present technology provide a method for performing maintenance on an electronic device enclosed within a container filled with immersion cooling liquid, the method comprising placing the container at least partly below a nozzle, the nozzle being configured to limit spread of immersion cooling liquid, lifting the electronic device out of the container, and, while lifting the electronic device out of the container, dispersing immersion cooling liquid from the electronic device by generating an air flow.

In some implementations of the present technology, the method further comprises reorienting the electronic device after lifting the electronic device out of the container, and placing the electronic device on an operation platform to allow an operator to perform maintenance on the electronic device on the operation platform.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative systems embodying the principles of the present technology.

Figure 1:
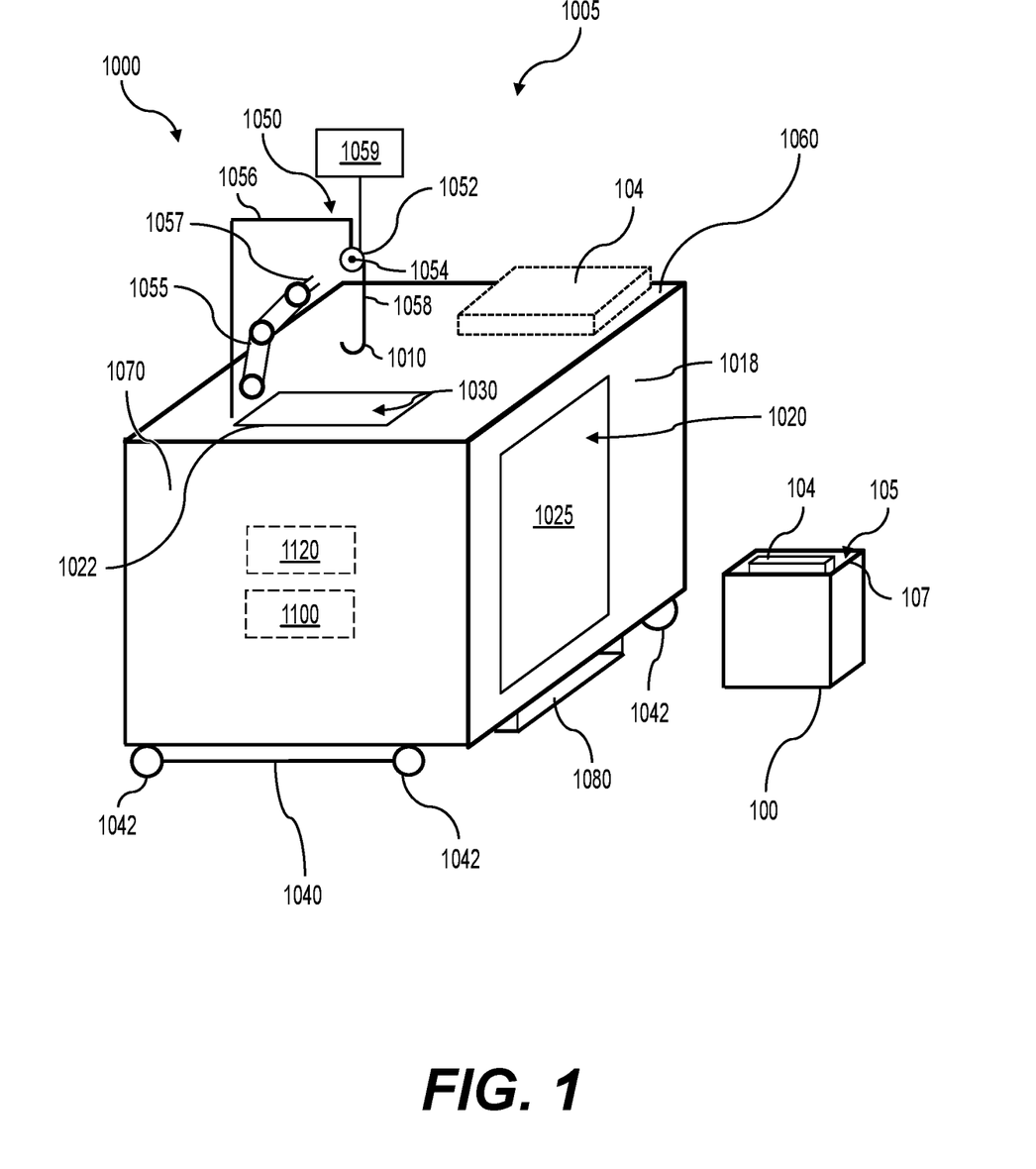
FIG. 1 is a perspective view of a container and an extraction system according to one embodiment of the present technology.

FIG. 1 illustrates a container 100 and an extraction system 1000 according to one embodiment of the present technology. As will be explained below, the container 100 and the extraction system 1000 are configured for use in a data center. Notably, the container 100 defines an internal volume 105 which is configured to at least partially receive therein a heat-generating electronic device 104. In this embodiment, the electronic device 104 is a computer system, namely a server. It is contemplated that, in other embodiments, the electronic device 104 could be any other type of electronic device suitable for use in a data center such as networking equipment or power equipment.

Figure 8:
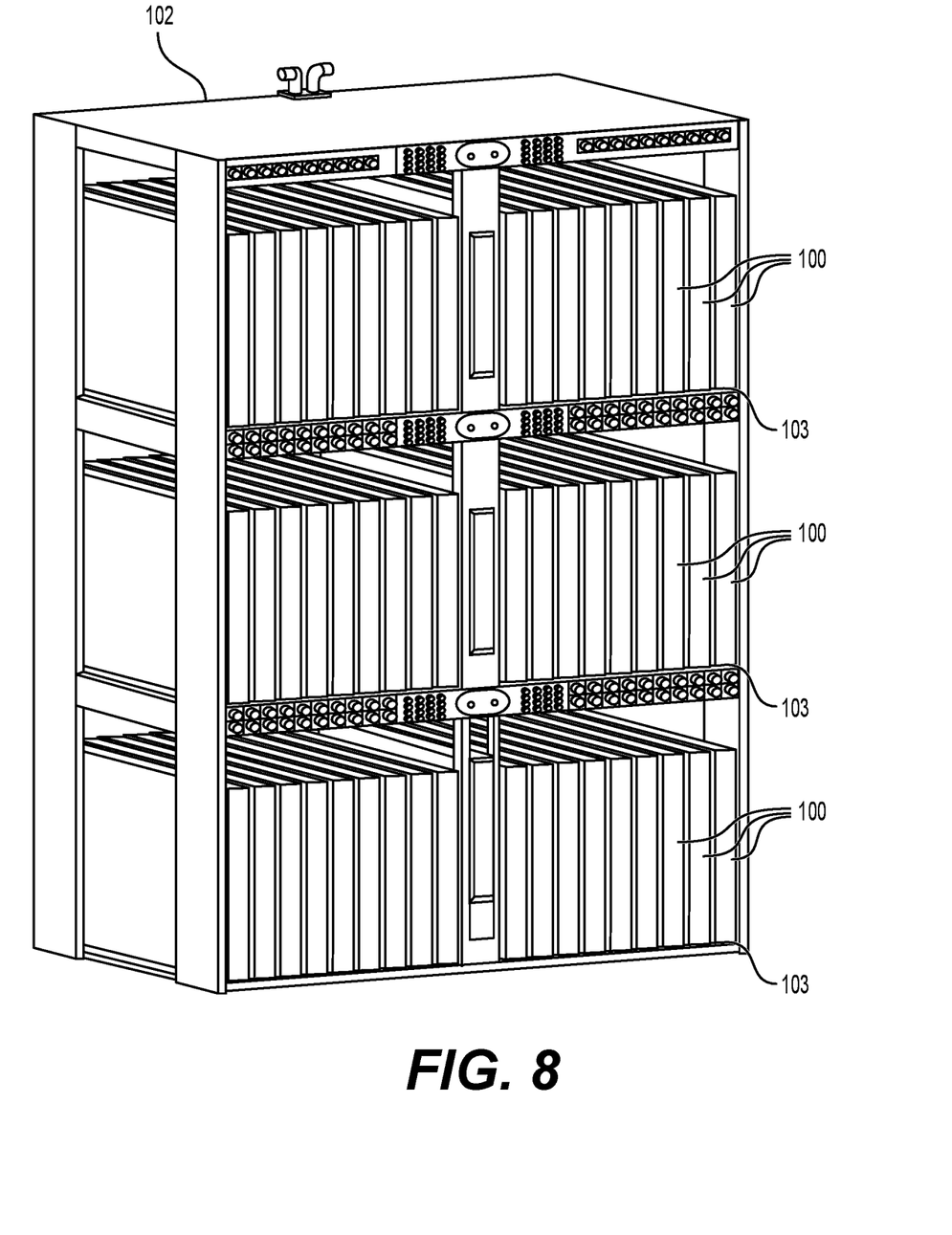
FIG. 8 shows a perspective view of a rack frame housing multiple containers such as the container of FIG. 1.

In use, the internal volume 105 of the container 100 is also filled with an immersive cooling liquid, such as a dielectric cooling liquid, which absorbs thermal energy from the electronic device 104 in the container 100. As such, the container 100 functions as an "immersion tank". In this example, with reference to FIG. 8, a rack frame 102 is provided in the data center for storing and supporting multiple containers 100. In particular, the rack frame 102 defines multiple shelves 103 on which the containers 100 are disposed. The containers 100 may be disposed side-by-side to more efficiently exploit a volume of the rack frame 102. This arrangement may provide for mounting a large number of such containers 100 in the rack frame 102.

As will be described in greater detail below, the extraction system 1000 of the present technology is provided to extract the electronic device 104 from the container 100 in which it is stored in such a manner as to remove the immersive cooling liquid that sticks to the electronic device 104 upon its extraction from the container 100. This can help minimize spills and waste of the immersive cooling liquid and also facilitate handling of the electronic device 104 by an operator.

Figure 2:
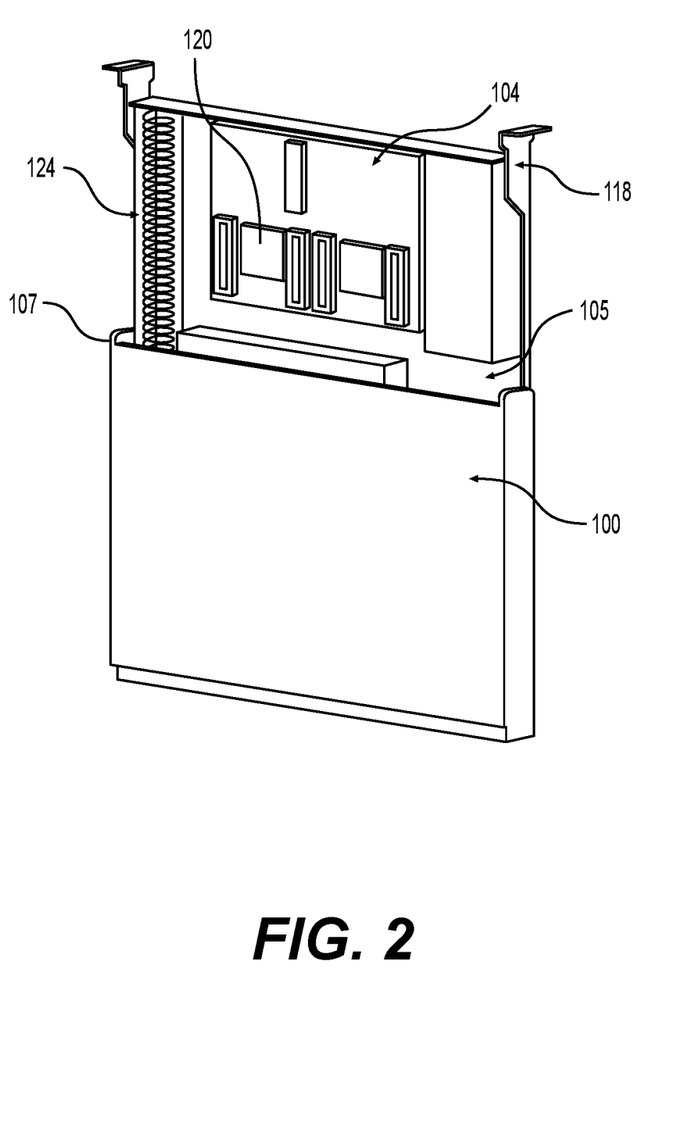
FIG. 2 is a perspective view of an electronic device partially received within the container of FIG. 1.

As best shown in FIG. 2, the electronic device 104 is configured to be inserted and removed from the container 100 through an open end 107 (corresponding to an upper end) of the container 100. The electronic device 104 has a detachable frame 118 and a plurality of electric components 120 connected thereto. For instance, the electronic components 120 may include a central processing unit (CPU), a graphics processing unit (GPU) and any other suitable electronic components. In this embodiment, the detachable frame 118 also hosts a convection-inducing structure 124 to cool/induce convection in the immersion cooling liquid. In this example, the convection-inducing structure is a serpentine convection coil 124 attached to the detachable frame 118. The serpentine convection coil 124 may allow a flow of a circulating cooling liquid. The circulating cooling liquid, by means of convection, may cool down the immersion cooling liquid.

In some embodiments, in addition to immersion cooling, some of the electronic components 120 may be cooled using one or more thermal transfer devices, which may also be called "cold plates" or "water blocks" (although a liquid circulating through the "water blocks" may be any of a wide variety of known thermal transfer liquids, rather than water). Examples of heat-generating electronic components that may be cooled using such a thermal transfer devices include, but are not limited to, CPUs, GPUs, neural processing units (NPUs), tensor processing units (TPUs), power supply circuitry, and application specific integrated circuits (ASICs), including, for example, ASICs configured for high-speed cryptocurrency mining.

A more detailed description of the electronic device 104 can be found in European Patent Application No. 21306189.8, filed on Aug. 31, 2021, the entirety of which is incorporated by reference herein.

Returning now to FIG. 1, in this embodiment, the extraction system 1000 is installed in a cart 1005. Notably, the cart 1005 has a cart body 1070 including a chassis 1040, the cart body 1070 supporting the extraction system 1000. The cart 1005 also has a plurality of wheels 1042 connected to the cart body 1070 for allowing the cart 1005 to roll on a ground surface of the data center. As such, in this embodiment, the extraction system 1000 may be displaced and disposed in a vicinity of the container 100 enclosing the electronic device 104 to be extracted therefrom. In this example, the cart 1005 is manually directed by an operator. However, it is contemplated that the wheels 1042 could be powered by a motor for automated displacement of the cart 1005. In some embodiments, the cart 1005 may include a dedicated computer system, a chassis controller, and/or sensors. In other embodiments, the cart 1005 may comprise any other suitable mechanism for displacing the extraction system 1000 within the data center, such as endless tracks or a mechanism for traveling on rails. It is contemplated that any other suitable mobile carrier other than a cart may be provided with the extraction system 1000 in other embodiments. Moreover, in other embodiments, no mobile carrier may be provided and the extraction system 1000 may instead be provided on a stationary workstation.

In this embodiment, the cart body 1070 defines a first opening 1020 through which the container 100 can be inserted within an interior volume 1025 of the cart body 1070. In some cases, one or more rails may extend through the first opening 1020 to support and guide the container 100 from the rack frame 102 of the data center initially supporting the container 100 to the interior volume 1025 of the cart body 1070. In this embodiment, the operator manually places the container 100 within the interior volume 1025 of the cart body 1070 through the first opening 1020. The cart body 1070 also defines a second opening 1030 through which the electronic device 104 is removed from the interior volume 1025, as will be described in more detail below. As can be seen, in this embodiment, the first opening 1020 is defined by a front vertical surface 1018 of the cart body 1070 while the second opening 1030 is defined by a top horizontal surface 1022 of the cart body 1070 that is perpendicular to the front vertical surface 1018. As such, in this embodiment, the first and second openings 1020, 1030 extend along planes that are generally perpendicular to one another.

The extraction system 1000 will now be described in detail with reference to FIGS. 1 and 3 to 5. In this embodiment, as best shown in FIG. 1, the extraction system 1000 comprises a nozzle 1100, a means 1050 for lifting the electronic device 104 and a means 1120 for dispersing immersion cooling liquid from the electronic device 104 while extracting the electronic device 104 from the container 100. As will be described below, these components of the extraction system 1000 collaborate together to carefully and cleanly extract the electronic device 104 from the container 100 such as to avoid accidental spills and/or mishandling of the electronic device 104. In this embodiment, as shown in FIG. 1, the nozzle 1100 and the means 1120 are disposed within the interior volume 1125 of the cart body 1070.

Figure 3:
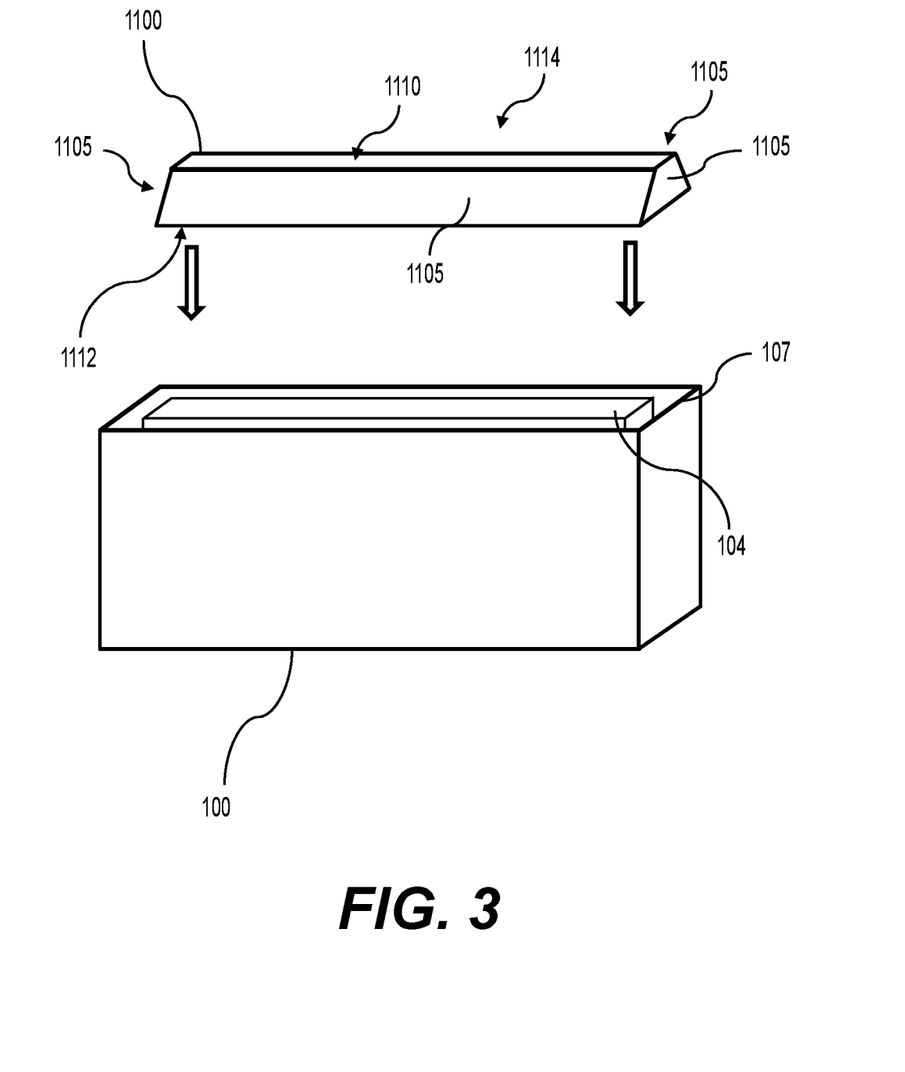
FIG. 3 is a perspective view of a nozzle of the extraction system of FIG. 1 being positioned above an open end of the container.

As shown in FIG. 3, the nozzle 1100 is configured to be positioned above the open end 107 of the container 100 in order to limit a spread of the immersion cooling liquid outside of the container 100 during extraction of the electronic device 104 therefrom. The nozzle 1100 has side walls 1105 defining an internal nozzle passage 1110 which extends from an inlet end 1112 on a lower side of the nozzle 1100 to an outlet end 1114 on an upper side of the nozzle 1100. As such, the inlet end 1112 may be referred as a lower end of the nozzle 1100, and the outlet end 1114 may be referred to as an upper end of the nozzle 1100. In this embodiment, the shape and dimensions of the inlet end 1112 are approximately the same as the shape and dimensions of the open end 107 of the container 100. Meanwhile, the shape and dimensions of the outlet end 1114 are slightly greater than the shape and dimensions of the electronic device 104 to allow the electronic device 104 to fit therethrough. As such, in this embodiment, the inlet end 1112 has a greater periphery (e.g., a greater width and/or length) than the outlet end 1114. The nozzle 1100 may thus be said to converge from the inlet end 1112 to the outlet end 1114. In this embodiment, the inlet and outlet ends 1112, 1114 are generally rectangular.

Figure 9:
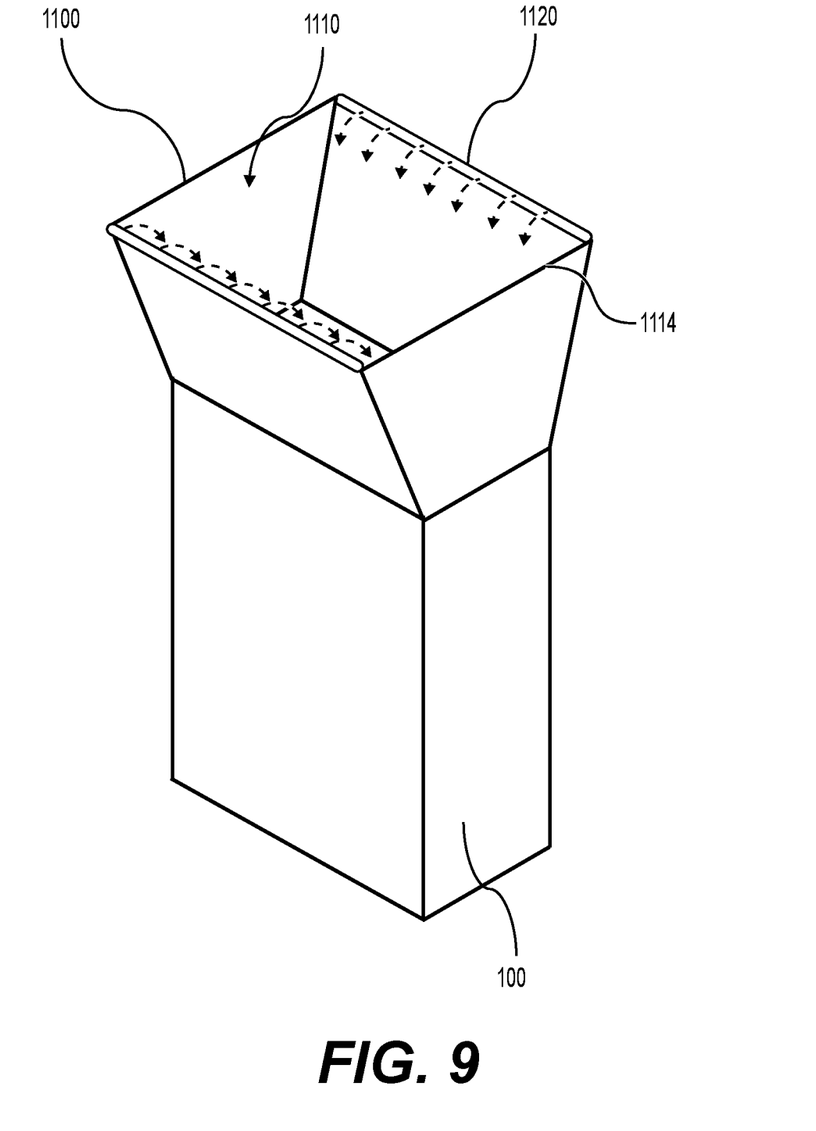
FIG. 9 shows part of the extraction system, including the nozzle and the liquid dispersing device, according to an alternative embodiment.

It is contemplated that the nozzle 1100 could be shaped differently. For instance, in other embodiments, as shown in FIG. 9, the nozzle 1100 may diverge (instead of converge) from the inlet end 1112 to the outlet end 1114. That is, the periphery of the outlet end 1114 (e.g., its width and/or length) may be greater than the periphery of the inlet end 1112. For example, this may be the case when the electronic device 104 has a cross-sectional profile, taken along a plane normal to the direction of insertion/removal of the electronic device 104 from the container 100, that is only slightly smaller than that of the container 100 since the diverging shape of the nozzle 1100 would allow the electronic device 104 to be removed from the nozzle 1100 through the outlet end 1114.

It is contemplated that the nozzle 1100 may be moveably connected to rails within the interior volume 1025 of the cart body 1070 such that a position of the nozzle 1100 above the electronic device 104 contained in the container 100 may be adjusted.

Returning now to FIG. 1, the means 1050 for lifting the electronic device 104 is configured to lift the electronic device 104 from the container 100. The means 1050 may thus be referred to as a lifting device 1050. In this embodiment, the lifting device 1050 includes a pulley 1052 rotatable about a pulley axis 1054. A bracket arm 1056 is connected to the cart body 1070 and supports the pulley 1052. In particular, the bracket arm 1056 extends from the top horizontal surface 1022 of the cart body 1070. Notably, as shown in FIG. 1, in this embodiment, the pulley 1052 and the bracket arm 1056, are disposed outside of the interior volume 1025. The lifting device 1050 also includes a line 1058 wrapped around the pulley 1052 and an attaching member 1010 connected to a free end of the line 1058. The line 1058 may be any suitable flexible link such as a wire, a cable or a rope. The line 1058 is wrapped about the pulley 1052 such that rotation of the pulley 1052 about the pulley axis 1054 causes the free end of the line 1058 to be deployed (lowered) or retracted (lifted). The attaching member 1010 is configured to be removably connected to a corresponding attaching member 108 (FIG. 5) of the electronic device 104. For instance, in this embodiment, the attaching member 1010 is a hook, and the electronic device 104 is thus provided with a loop 108 that can be engaged by the hook. It is contemplated that, in other embodiments, the attaching member 1010 could be a suction cup, a clamp, or any other mechanism suitable for removable connection to the electronic device 104.

Figure 7:
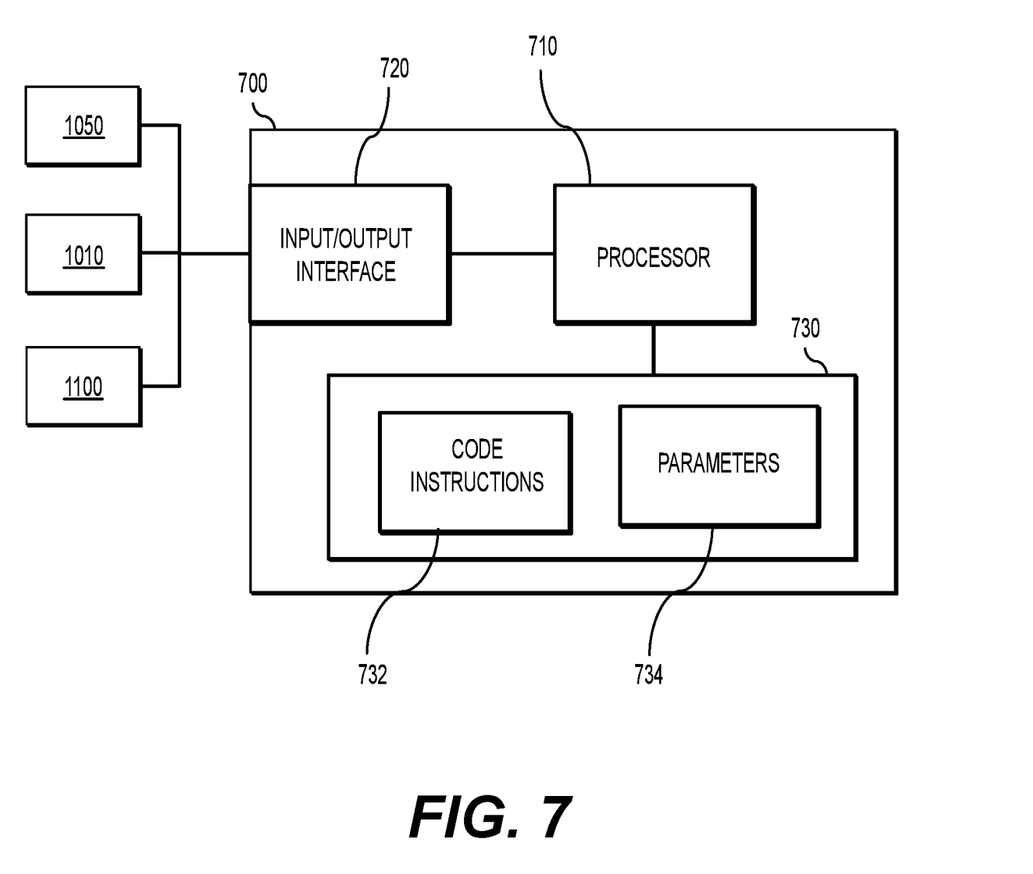
FIG. 7 is block diagram of a controller of the extraction system of FIG. 1.

In this embodiment, the lifting device 1050 also includes a motor 1059 operatively connected to the pulley 1052 to selectively cause rotation of the pulley 1052 about the pulley axis 1054 in order to deploy or retract the line 1058. A controller 700, shown in FIG. 7, is in communication with the motor 1059 to control actuation of the pulley 1052. For instance, the controller 700 can control the motor 1059 to cause the clockwise or counterclockwise rotation of the pulley 1052 about the pulley axis 1054. The controller 700 may also control the speed of the rotation of the pulley 1052 thereby controlling the speed at which the line 1058 is deployed and retracted. The controller 700 will be described in greater detail further below.

The motor 1059 could be omitted in other embodiments. In such embodiments, the pulley 1052 may be actuated manually for example.

Figure 4:
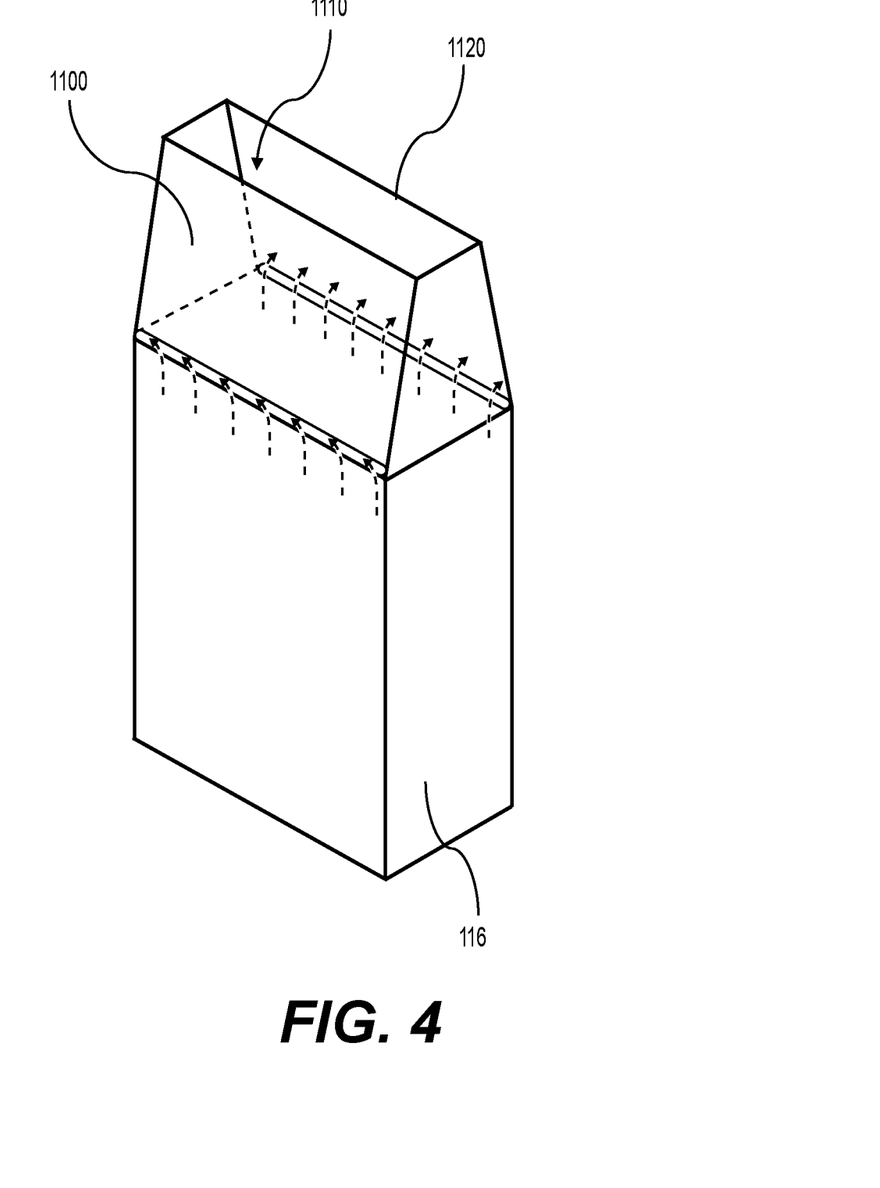
FIG. 4 is a perspective view of the nozzle and the container of FIG. 3, with the nozzle being disposed above and in proximity to the container.

The means 1120 for dispersing the immersion cooling liquid from the electronic device 104 removes the immersion cooling liquid from the electronic device 104 by generating an air flow. The means 1120 may thus be referred to as a liquid dispersing device 1120. In this embodiment, the liquid dispersing device 1120 is an aspirator for producing suction and is fluidly connected to the nozzle 1100. As shown in FIG. 4, in this embodiment, the liquid dispersing device 1120 is disposed on an inner contour of the inlet end 1112 of the nozzle 1100 such that, upon extraction of the electronic device 104, the immersion cooling liquid is removed from the electronic device 104 by the liquid dispersing device 1120 as it traverses through the internal nozzle passage 1110. It is contemplated that the liquid dispersing device 1120 could be positioned at the outlet end 1114 instead of the inlet end 1112, or at a location between inlet and outlet ends 1112, 1114. In this embodiment, the controller 700 is in communication with the liquid dispersing device 1120 to control actuation of the liquid dispersing device 1120. It is contemplated that, in other embodiments, a separate controller could control the liquid dispersing device 1120.

It is contemplated that, in other embodiments, the liquid dispersing device 1120 may be a blower instead of an aspirator. As such, the liquid dispersing device 1120 could generate an air flow to blow, e.g., in an upward or downward direction, the immersion cooling liquid off the electronic device 104. Such an embodiment is illustrated for example in FIG. 9, in which the liquid dispersing device 1120 is a blower for generating an air flow that blows the immersion cooling liquid off the electronic device 104 during its extraction from the container 100. As shown in FIG. 9, in this example, the dispersing device 1120 is disposed on an inner contour of the outlet end 1114 of the nozzle 1100 such that, upon extraction of the electronic device 104 from the container 100, a greater proportion of the outer surfaces of the electronic device 104 is exposed to the air blown by the liquid dispersing device 1120 as the electronic device 104 traverses through the internal nozzle passage 1110. As such, in this example, the air blown by the liquid dispersing device 1120 flows in a downward direction and towards the open end 107 of the container 100. Part of the immersion cooling liquid removed from the electronic device 104 may thus be projected back into the container 100. It should be understood that the liquid dispersing device 1120 implemented as a blower may also be used in conjunction with the nozzle 1100 having the converging shape (shown in FIGS. 2 to 5).

Returning now to FIG. 1, the extraction system 1000 further comprises a robotic control arm 1055 configured to receive the electronic device 104 from the lifting device 1050 and change an orientation of the electronic device 104 for positioning onto an operation platform 1060. The operation platform 1060 corresponds to the location on the cart 1050 at which an operator would perform maintenance on the electronic device 104. In this embodiment, the operation platform 1060 is defined by the top horizontal surface 1022 of the cart body 1070. It is contemplated that the operation platform 1060 could be defined by a different surface (e.g., a surface of another cart or workstation). The control arm 1055 is connected to the cart body 1070 and is disposed next to the lifting device 1050. In this embodiment, the control arm 1055 has a grip 1057 configured to grasp the electronic device 104 to allow the control arm 1055 to manipulate the electronic device 104. The control arm 1055 has articulations which allow the control arm 1055 to pivot along various axes in order to move the grip 1057 (and the electronic device 104 when grasped thereby) to a desired location. For example, two consecutive articulations of the control arm 1055 are connected by a control arm section such that each control arm section is rotatable to extend at an adjustable angle in any direction relatively to a successive control arm section.

In this embodiment, the controller 700 is in communication with the control arm 1055 to control actuation of the control arm 1055. It is contemplated that, in other embodiments, a separate controller could control the control arm 1055.

Figure 6:
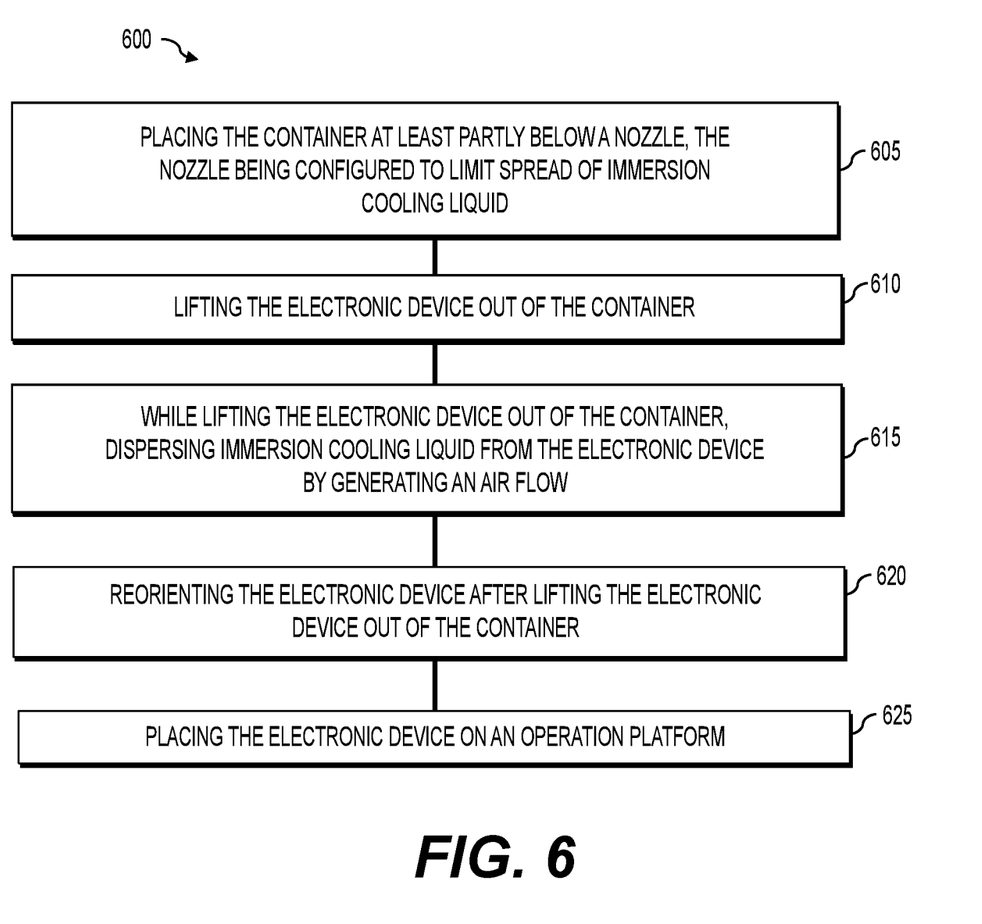
FIG. 6 is a flow diagram showing operations of a method for performing maintenance on the electronic device of FIG. 2 enclosed within the container filled with immersion cooling liquid according to one embodiment of the present technology.

A method 600 for performing maintenance on the electronic device 104 enclosed within the container 100 will now be described with reference to FIG. 6. Some operations or portions of operations in the flowchart of FIG. 6 may be executed concurrently, omitted or changed in order.

The method 600 comprises placing, at operation 605, the container 100 at least partly below the nozzle 1100. More particularly, in this embodiment, the operation 605 comprises inserting the container 100 within the interior volume 1025 of the cart body 1070 through the first opening 1020, and positioning the container 100 on a support surface of the cart body 1070 such that the open end 107 of the container 100 is disposed below the nozzle 1100. In particular, the inlet end 1112 of the nozzle 1100 is disposed in close proximity to the open end 107 of the container 100. In some embodiments, the nozzle 1100 itself may be movable such that, after positioning the container 100 within the cart body 1070, the nozzle 1100 is movable (e.g., downward) to bring the inlet end 1112 thereof in close proximity to the open end 107 of the container 100.

The method 600 further comprises lifting, at operation 610, the electronic device 104 out of the container 100. More specifically, in this embodiment, the pulley 1052 is actuated (via the motor 1059) such as to unroll the line 1058 by rotation of the pulley 1052 in order for the attaching member 1010 to reach the electronic device 104 within the interior volume 1025. As such, in this example, the line 1058, when deployed, extends through the second opening 1030 and through the outlet end 1114 of the nozzle 1100. The attaching member 1010 is then attached to an attachment point 106 of the electronic device 104. For example, the attaching member 1010, which in this embodiment is a hook, can engage the loop 108 provided at the attachment point 106 of the electronic device 104. Once the attaching member 1010 is engaged with the electronic device 104, the pulley 1052 is actuated to retract the line 1058 and the attaching member 1010 which causes the electronic device 104 to slide out of the container 100 and be lifted upwards into the internal nozzle passage 1110 of the nozzle 1100. In particular, the electronic device 104 is directed towards the outlet end 1114 of the nozzle 1100.

As the electronic device 104 is being removed from the container 100 via the lifting device 1050, a certain amount of the immersion cooling liquid sticks to the outer surfaces of the electronic device 104 due to the significant viscosity of the immersion cooling liquid. In order to prevent this immersion cooling liquid from spilling out thereby causing waste, at operation 615, the method 600 further comprises dispersing the immersion cooling liquid from the electronic device 104 by generating an air flow. Notably, the controller 700 actuates the liquid dispersing device 1120 to aspirate the immersion cooling liquid from the electronic device 104 while the lifting device 1050 lifts the electronic device 104 from the container 100. As such, in this embodiment, the controller synchronously actuates the lifting device 1050 and the liquid dispersing device 1120. It is contemplated that the speed at which the electronic device 104 is lifted from the container 100 by the lifting device 1050 (i.e., determined by the speed of the motor 1059) may be based on the air flow generated by the liquid dispersing device 1120 in order to efficiently remove the immersion cooling liquid from the electronic device 104.

During this operation, the inner surfaces of the nozzle 1100 prevent droplets of the immersion cooling liquid from being projected outwards, thereby limiting the spread of the immersion cooling liquid that could be caused by the air flow generated by the liquid dispersing device 1120. Since in this embodiment the liquid dispersing device 1120 is disposed along the outlet end 1114 of the nozzle 1100, an entirety of the height of the electronic device 104 traverses the liquid dispersing device 1120 in order to maximize its efficiency.

As best shown in FIG. 1, in this embodiment, the cart 1050 comprises a collecting bin 1080 for receiving immersion cooling liquid that is removed from the electronic device 104. In this embodiment, the liquid dispersing device 1120 is fluidly connected to the collecting bin 1080 to route the immersion cooling liquid aspirated from the electronic device 104 to the collecting bin 1080 via a conduit (not shown) that extends from the liquid dispersing device 1120 to the collecting bin 1080. Moreover, while the nozzle 1100 helps to limit the spread of the immersion cooling liquid, any immersion cooling liquid that is not stopped by the nozzle 1100 could be collected by the collecting bin 1080. For instance, in this example, the collecting bin 1080 is disposed below the nozzle 1100 and the container 100 to receive any immersion cooling liquid from above. A filter may be disposed atop the collecting bin 1080 (and within the conduit fluidly connecting the liquid dispersing device 1120 to the collecting bin 1080) such that impurities contained in immersion cooling liquid are filtered out before the immersion cooling liquid enters the collecting bin 1080. Immersion cooling liquid collected in the collecting bin 1080 may be re-used and redirected in the container 100 or in another container.

As mentioned above, it is contemplated that in other embodiments, the liquid dispersing device 1120 could be a blower rather than an aspirator. In such embodiments, the air flow generated by the liquid dispersing device 1120 causes the immersion cooling liquid to be blown off from the electronic device 104 towards the container 100. The collecting bin 1080 would thus be positioned below the container 100 to receive any immersion cooling liquid that is blown off but does not enter the container 100.

Figure 5:
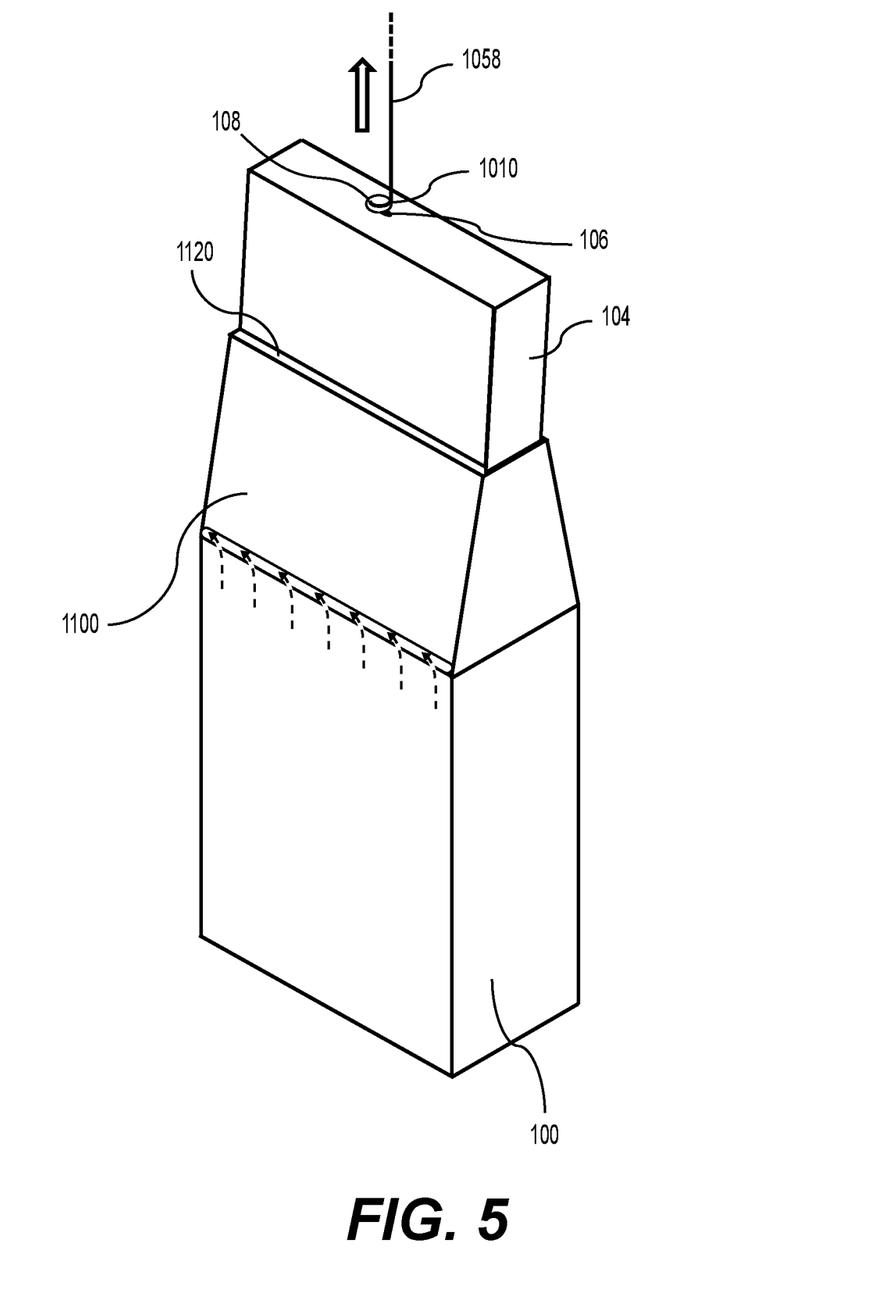
FIG. 5 is a perspective view of the nozzle, the container and part of a lifting device connected to the electronic device for extraction thereof from the container.

Returning now to FIG. 6, in this embodiment, at operation 620, the method 600 further comprises, after lifting the electronic device 104 out of the container 100, reorienting the electronic device 104. Notably, as shown in FIG. 5, the electronic device 104 is retrieved from the container 100 in a generally upright vertical orientation. However, the operator preferably performs maintenance on the electronic device 104 with the electronic device 104 in a generally horizontal orientation (approximately 90° from the vertical orientation). Therefore, in order to reorient the electronic device 104 after it is lifted out of the container 100, in this embodiment, the controller 700 controls the control arm 1055 to grasp the extracted electronic device 104 in the vertical orientation shown in FIG. 5 and rotate it about at least one axis to place the electronic device 104 in the horizontal orientation. In order for the connection of the lifting device 1050 to the electronic device 104 not to impede the movement of the electronic device 104 by the control arm 1055, in this embodiment, the motor 1059 is controlled such as to allow free rotation of the pulley 1052. It is contemplated that, in alternative embodiments, the control arm 1055 may be omitted and the operator may manually grasp and reorient the electronic device 104 once the electronic device 104 has been lifted out of the container 100.

Next, at operation 625, the electronic device 104 is placed on the operation platform 1060 to allow the operator to perform maintenance on the electronic device 104 on the operation platform 1060. More specifically, in this embodiment, the control arm 1055 positions the electronic device 104 on the operation platform 1060 in the horizontal orientation as shown in dashed lines in FIG. 1. In this embodiment, once the electronic device 104 is placed on the operation platform 1060, the operator disconnects the electronic device 104 from the attaching member 1010 and the operator can then freely perform maintenance on the electronic device 104. It is contemplated that, in alternative embodiments where the control arm 1055 is omitted, the operator may manually place the electronic device 104 on the operation platform 1060. Once maintenance is concluded, the electronic device 104 can be placed back into the container 100. Immersion cooling liquid from the collecting bin 1080 may be used to fill the container 100 as the container 100 could have lost a small amount of immersion cooling liquid during extraction of the electronic device 104.

As an example, FIG. 7 is a schematic block diagram of the controller 700 of the extraction system 1000 according to an embodiment of the present technology. The controller 700 comprises a processor or a plurality of cooperating processors (represented as a processor 710 for simplicity), a memory device or a plurality of memory devices (represented as a memory device 730 for simplicity), and an input/output interface 720 allowing the controller 700 to communicate with other components of the extraction system 1000 and/or other components in remote communication with the extraction system 1000. The processor 710 is operatively connected to the memory device 730 and to the input/output interface 720. The memory device 730 includes a storage for storing parameters 734, including for example and without limitation the above-mentioned pre-defined speed of extraction of the electronic device 104. The memory device 730 may comprise a non-transitory computer-readable medium for storing code instructions 732 that are executable by the processor 710 to allow the controller 700 to perform the various tasks allocated to the controller 700 in the method 600.

The controller 700 is operatively connected, via the input/output interface 720, to the lifting device 1050, the liquid dispersing device 1120 and the control arm 1055. The controller 700 executes the code instructions 732 stored in the memory device 730 to implement the various above-described functions that may be present in a particular embodiment. FIG. 7 as illustrated represents a non-limiting embodiment in which the controller 700 orchestrates operations of the control arm 1050, the liquid dispersing device 1120 and the lifting device 1050. This particular embodiment is not meant to limit the present disclosure and is provided for illustration purposes.

It will be understood that, although the embodiments presented herein have been described with reference to specific features and structures, various modifications and combinations may be made without departing from the disclosure. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. An extraction system for extracting an electronic device from a container filled with an immersion cooling liquid, the extraction system comprising:
    a lifting device for lifting the electronic device from an open end of the container;
    a liquid dispersing device for dispersing immersion cooling liquid from the electronic device by generating an air flow; and
    a nozzle configured to be positioned above the open end of the container to limit a spread of immersion cooling liquid caused by the air flow the liquid dispersing device being configured for aspirating the immersion cooling liquid such that immersion cooling liquid is aspirated off the electronic device.

2. The extraction system of claim 1, wherein a lower end of the nozzle has a same shape as the open end of the container.

3. An extraction system for extracting an electronic device from a container filled with an immersion cooling liquid, the extraction system comprising:
    a lifting device for lifting the electronic device from an open end of the container;
    a liquid dispersing device for dispersing immersion cooling liquid from the electronic device by generating an air flow; and
    a nozzle configured to be positioned above the open end of the container to limit a spread of immersion cooling liquid caused by the air flow, The extraction system of claim 1, wherein the liquid dispersing device being located within the nozzle.

4. The extraction system of claim 1, further comprising a controller in communication with the lifting device and in communication with the liquid dispersing device, the controller being operable to actuate the lifting device synchronously with the liquid dispersing device.

5. The extraction system of claim 1, wherein the lifting device extends at least in part within the nozzle in order to lift the electronic device through the nozzle.

6. The extraction system of claim 1, wherein the lifting device comprises:
    a pulley rotatable about a pulley axis;
    a line wrapping around the pulley; and
    an attaching member connected to the line and configured to be attached to an attachment point of the electronic device.

7. The extraction system of claim 6, wherein the lifting device further comprises a motor operatively connected to the pulley to selectively cause rotation of the pulley about the pulley axis in order to lift the attaching member.

8. A cart for performing maintenance on a server system, the cart comprising:
    a cart body;
    a plurality of wheels connected to the cart body;

an extraction system for extracting an electronic device from a container filled with an immersion cooling liquid, the extraction system comprising:
- a lifting device for lifting the electronic device from an open end of the container;
- a liquid dispersing device for dispersing immersion cooling liquid from the electronic device by generating an air flow; and
- a nozzle configured to be positioned above the open end of the container to limit a spread of immersion cooling liquid caused by the air flow, the extraction system being supported by the cart body;

an operation platform for operating on the electronic device after extraction from the container; and a control arm configured to receive the electronic device from the lifting device and change an orientation of the electronic device for positioning onto the operation platform.

9. The cart of claim 8, wherein:

the control arm is configured to rotate the electronic device from a generally vertical orientation to a generally horizontal orientation in order to position the electronic device on the operation platform in the generally horizontal orientation.

10. The cart of claim 8, further comprising a collecting bin for receiving immersion cooling liquid that is removed from the electronic device, the collecting bin being disposed below the nozzle.

11. The cart of claim 10, further comprising a filter for filtering out impurities contained in immersion cooling liquid being routed to the collecting bin.

12. A method for performing maintenance on an electronic device enclosed within a container filled with immersion cooling liquid using the extraction system of claim 1, the method comprising:

placing the container at least partly below the nozzle, the nozzle being configured to limit spread of immersion cooling liquid;

lifting the electronic device out of the container; and while lifting the electronic device out of the container, dispersing immersion cooling liquid from the electronic device by generating the air flow.

13. The method of claim 12, further comprising:

reorienting the electronic device after lifting the electronic device out of the container; and placing the electronic device on an operation platform to allow an operator to perform maintenance on the electronic device on the operation platform.

\* \* \* \* \*

UNITED STATES PATENT AND TRADEMARK OFFICE
CERTIFICATE OF CORRECTION

PATENT NO. : 12,200,901 B2
APPLICATION NO. : 17/690839
DATED : January 14, 2025
INVENTOR(S) : Ali Chehade et al.

Page 1 of 1

It is certified that error appears in the above-identified patent and that said Letters Patent is hereby corrected as shown below:

In the Claims

Column 12, Claim 1, Line 25 should read --liquid caused by the air flow, the liquid dispersing--

Column 12, Claim 3, Lines 42-44 should read --liquid caused by the air flow, the liquid dispersing device being located within the nozzle.--

Signed and Sealed this
Eleventh Day of February, 2025

Coke Morgan Stewart
*Acting Director of the United States Patent and Trademark Office*